(12) United States Patent
Chien

(10) Patent No.: US 6,434,033 B1
(45) Date of Patent: Aug. 13, 2002

(54) DRAM MODULE AND METHOD OF USING SRAM TO REPLACE DAMAGED DRAM CELL

(76) Inventor: Pien Chien, No. 144, Chi-Long Rd. Sec 3, Taipei (TW)

( * ) Notice: Subject to any disclaimer, the term of this patent is extended or adjusted under 35 U.S.C. 154(b) by 0 days.

(21) Appl. No.: 09/726,473

(22) Filed: Nov. 30, 2000

(51) Int. Cl.$^7$ .............................................. G11C 15/00
(52) U.S. Cl. ........................................ 365/49; 365/200
(58) Field of Search ......................... 365/49, 200, 201, 365/149, 154

(56) References Cited

U.S. PATENT DOCUMENTS

| | | | | |
|---|---|---|---|---|
| 5,469,390 A | * | 11/1995 | Sasaki et al. ................ | 365/200 |
| 5,640,353 A | * | 6/1997 | Ju ................................ | 365/200 |
| 5,778,056 A | * | 7/1998 | Barr ........................ | 395/182.05 |
| 5,996,096 A | * | 11/1999 | Dell et al. ................... | 714/710 |
| 6,041,422 A | * | 3/2000 | Deas .............................. | 714/8 |
| 6,173,238 B1 | * | 1/2001 | Fujisaki ...................... | 702/117 |

* cited by examiner

*Primary Examiner*—Richard Elms
*Assistant Examiner*—Anh Phung
(74) *Attorney, Agent, or Firm*—J.C. Patents

(57) ABSTRACT

A DRAM module and a method of replacing a damaged DRAM cell in the DRAM module with a SRAM. The DRAM module has at least a non-volatile memory and a DRAM control logic circuit. In the process of replacing the damaged DRAM with the SRAM, the damaged address data is compared to DRAM address data. If the data are consistent, the address of the SRAM is used to access data. Meanwhile, the output enabling signal of the DRAM cell is turned off. It can thus assist the computer to correctly find the good DRAM cell for data access, so as to ensure a normal operation of the computer.

29 Claims, 2 Drawing Sheets

DRAM MODULE AND METHOD OF USING SRAM TO REPLACE DAMAGED DRAM CELL

BACKGROUND OF THE INVENTION

1. Field of the Invention

The invention relates in general to a dynamic random access memory (DRAM) module and a method of using a static random access memory (SRAM) to replace the damage DRAM cell in the DRAM module.

2. Description of the Related Art

In the development of the personal computer, the DRAM plays a very important role. From the early unit of kilobyte to the current unit of Megabyte, the memory capacity has been continuously expanded. Plus that the processing speed of the central processing unit (CPU) keeps increasing, the data process and operation capability of the modern computer has been greatly advanced. The capacity of DRAM is an indicate the processing capability of the CPU. With a large capacity of the DRAM, more data can be processed, and more programs can be open at a time for the computer.

FIG. 1 shows a conventional DRAM module. The data access method is described as follows. During a reading operation, the DRAM control logic circuit 20 receives an address data from a system bus 25. The address data is decoded and compared to the address data in the DRAM 10. When the DRAM control signal is a reading command, the DRAM puts the data of this address in the system bus 25 via the DRAM control logic circuit 20 to complete the reading operation.

In a writing operation, the DRAM control logic circuit 20 receives an address data from the system bus. The address data is decoded and compared to the address of the DRAM 10. When the DRAM control signal is a write command, the DRAM 10 puts the data in the system bus 25 to the address via the DRAM control logic circuit 20 to complete the write operation.

However, when one of the DRAM module is damaged, error will occur in the data stored therein, or incorrect data will be stored. The whole module thus has to be abandoned and replaced by a new DRAM module to retrieve the normal operation of the computer. Or alternatively, if some of the memory cells are damaged while fabricating the DRAM in the manufacture, these damaged DRAM's with defects cannot be used to fabricate the DRAM module. The abandonment is inevitable to cost a great loss. The above conventional DRAM module cannot be applied while damaged memory cell occurs to cause a great waste.

SUMMARY OF THE INVENTION

The invention provides a DRAM module with a SRAM to replace a damaged DRAM cell, and a method of the same. The damaged address data is compared to a DRAM address data. When the damaged address data is identical to the DRAM address data, an address of a SRAM is used for data access, and an output enabling signal of the DRAM is turned off.

The above DRAM module with the SRAM to replace the damaged DRAM cell comprises at least a non-volatile memory and a DRAM control logic circuit.

The non-volatile memory is used as an initial program lead. The damaged address data are saved in an content addressable memory via a power on operation. The content addressable memory is coupled to the non-volatile memory, the DRAM, and the SRAM. While receiving the address data of the DRAM, the damaged address data are compared to the address of the DRAM to output a match signal. The DRAM control logic circuit is coupled to a system bus, the content addressable memory, the DRAM and the SRAM for receiving the address data, the DRAM control signal and the data signal. According to the DRAM control signal, the data signal is accessed in the SRAM. Or alternatively, according to address of the DRAM and the DRAM control signal, the data signal is accessed in the DRAM. In another alternative, the data signal is written in the content addressable memory according to the DRAM control signal and the address data of the DRAM.

The invention uses a SRAM to replace the damaged DRAM cell. The damaged address data is compared the to address data of the DRAM to output the match data to enable the certain address of the SRAM. Meanwhile, the output enabling signal of the DRAM is turned off.

In addition, the step of removing the surface portion of the substrate to have the substrate coplanar with the oxide layer in the trench does not damage the substrate surface around the trenches.

Both the foregoing general description and the following detailed description are exemplary and explanatory only and are not restrictive of the invention, as claimed.

DESCRIPTION OF THE PREFERRED EMBODIMENTS

Figure 2:
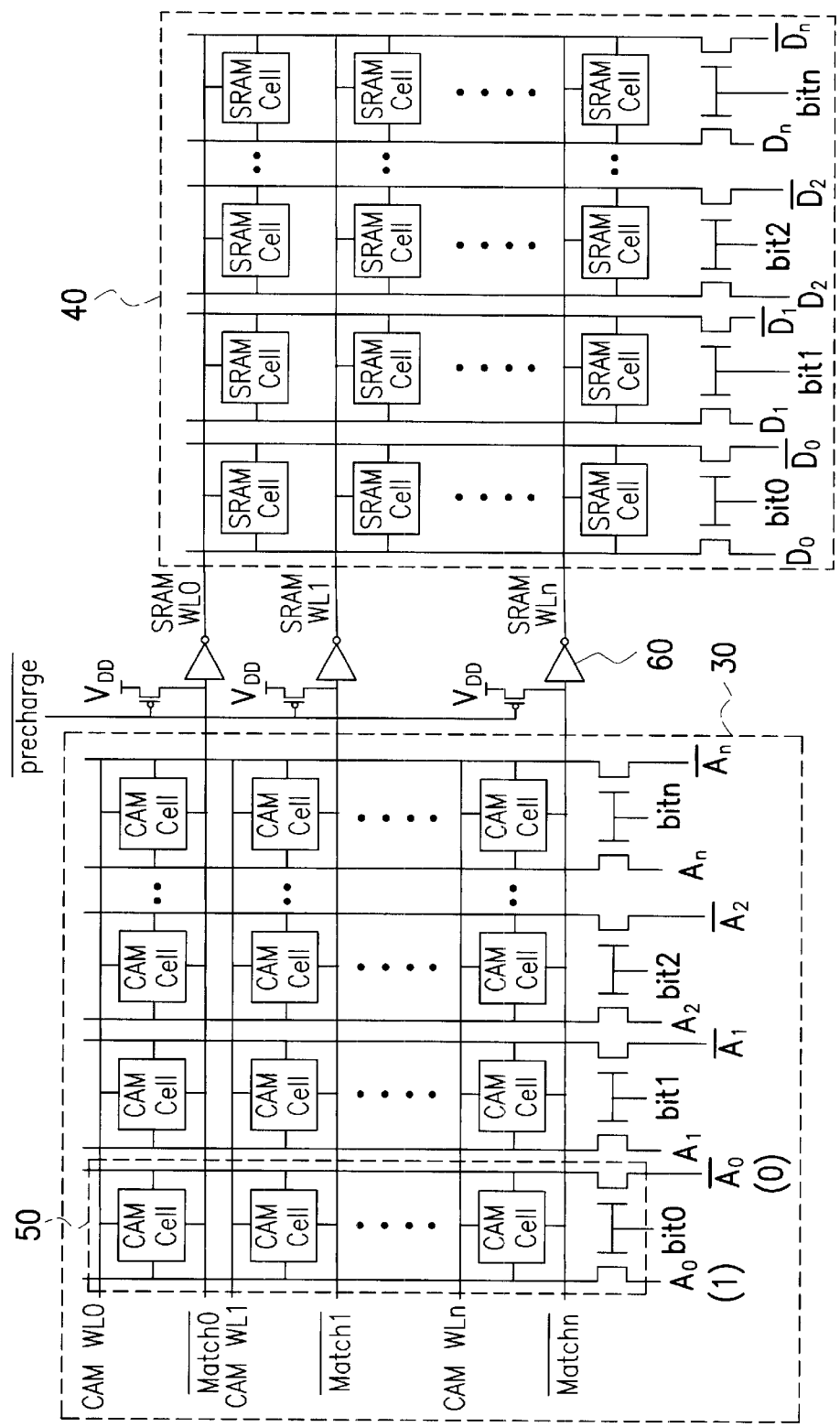
FIG. 2 shows a connection between an content addressable memory and a SRAM.

Referring to FIG. 2, a connection between a content addressable memory (CAM) 30 and a SRAM 40 are illustrated. The content addressable memory 30 is a special and seldom used memory, however, very useful in high speed look up table. The content addressable memory 30 can receive a data word as the input ($A_0$~$An$). When the data stored in the content addressable memory array 30 is the same as the data word, a match signal is generated to indicate that the data of the address and the data word are the same. The content addressable memory 30 can be used as a normal SRAM for data access. However, the structure of the content address memory 30 is more complicated compared to the SRAM 40. The circuit structure of the SRAM 40 includes selecting the bit lines ($D_0$~$Dn$) to read or write the data in the memory cell.

In this embodiment, during the write cycle, the damaged address data can be written into the content addressable memory 30. The operation for this step is the same as the operation of a SRAM. That is, one word line (CAM WL0~CAM WLn) is selected, and the damaged address data is stored in the bit line ($A_0$~$An$) and written into the memory cell. In a non-comparison cycle, all the match signals will be precharged to a high voltage. In a comparison cycle, all the word lines are turned off, and a DRAM address data used for comparison is put in the bit lines ($A_0$~$An$). If one of the damaged address data is the same as the DRAM address, a certain match signal is grounded, while other match signals are maintained at a high voltage. Being grounded, the certain match signal is going through a reverse amplifier 60 and becomes an input for one of the word line (SRAM WL0~SRAM WLn) of the SRAM 40. The data access can be operated in a SRAM cell that the word line refers via the bit lines ($D_0$~$Dn$). In addition, a parity bit 50 is disposed in the memory cells of the content addressable memory 30 to provide a better modification of the above circuit. When the data of the memory cell is the damaged address data, the parity bit position digital signal is "1". When the data of the memory cells is meaningless, the parity bit position digital signal is "0". The digital signal "1" is disposed on the bit line ($A_0$) corresponding to the parity bit 50. Only when the damaged address data is the same as the DRAM address data, and the digital signal is "1", the certain match signal is operated. This is to prevent the mistake occurring when the meaningless data is the same as the DRAM address data.

Figure 1:
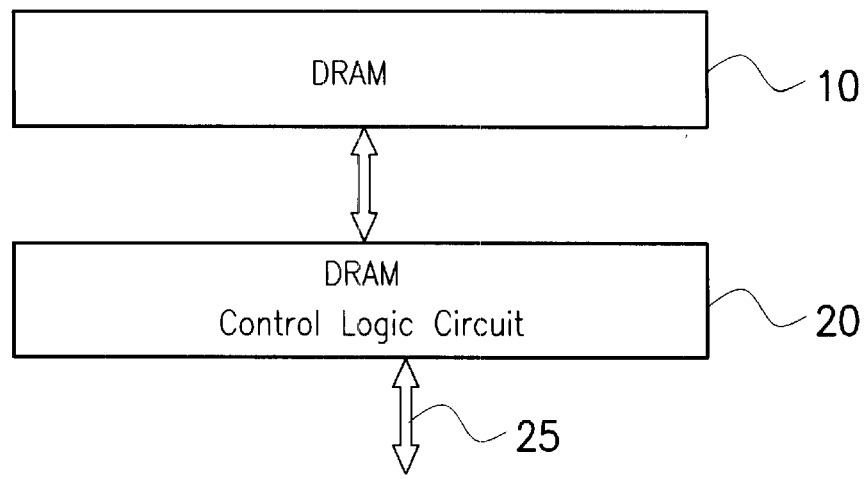
FIG. 1 shows a conventional DRAM module.
Figure 3:
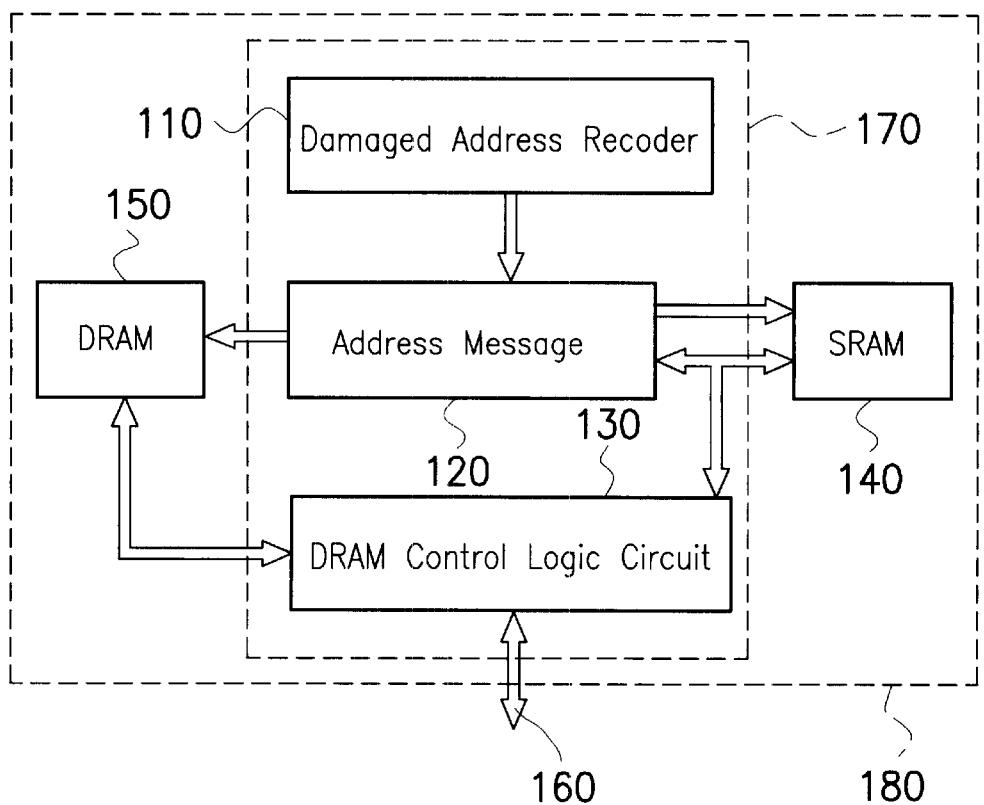
FIG. 3 is a block diagram showing a DRAM module using a SRAM to replace the damaged DRAM cell.

In FIG. 3, a preferred embodiment of a DRAM module 180 using a SRAM to replace a damaged DRAM cell is illustrated. When the power is on, a power up pulse is generated. This pulse defines a pulse cycle to pre-store the damaged address data in a damaged address recorder 110. The damaged address recorder 110 comprises an electrically programmable read only memory, an electrically erasable programmable read only memory such as a flash memory, a programmable logic array, or a programmable fuse, for example. The damaged address data is then input to in the content addressable memory 120 by the power up signal. Each damaged address datum comprises a parity bit. The DRAM control logic circuit 130 receives a DRAM address datum from the system bus 160. The DRAM address datum is compared to the damaged address data stored in the content addressable memory 120. When one of the damaged address data is the same as the DRAM address datum, one certain match signal will enable a certain address of the SRAM, and this certain match signal will disable the output enabling signal of the DRAM. The DRAM control logic circuit 130 then receives and outputs a DRAM control signal and a data signal from the system bus 160. After receiving the DRAM control signal, the SRAM 140 can the access the data signal. Since the DRAM 150 output enabling signal has been disabled, the DRAM cannot access the data signal. When the DRAM address datum is different from any of the damaged address data, the certain match signal cannot enable the SRAM. The certain match signal enables the output enabling signal of the DRAM. The DRAM control logic circuit 130 then receives the DRAM control signal and the data signal from the system bus 160 and output these signals. According to the DRAM address data, the DRAM 150 and the received DRAM control signal, the DRAM 150 can thus access the data signal. Since the SRAM 150 is not enabled by the certain match signal, therefore, it cannot access the data signal.

In this invention, the content addressable memory 120 is provided to enhance the performance of the non-volatile memory 110 and the system, so that the speed for memory access of the system can be improved. If the speeds of non-volatile memory 110 and the system can be matched with each other, the content addressable memory 120 can be removed from the system, while the comparing function can be performed by the DRAM control logic circuit 130.

Using the SRAM to replace the damaged DRAM, the damaged address data can be pre-stored in the non-volatile memory. Via the content addressable memory, the damaged address data is compared to the DRAM address data. If the data are the same, the address of SRAM is used for data access, and the output enabling signal of the DRAM is disabled.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A DRAM module using a SRAM to replace a damaged DRAM cell, the DRAM module coupled to a system bus and being activated by a power up signal, comprising:

a damaged address recorder, to pre-store a plurality of damaged address data, and to output the damaged address data by a power up signal;

a content addressable memory, coupled to the damaged address recorder, to write the damaged address data therein, and to receive a DRAM address data to compare to the damaged address data to output a match signal;

a SRAM, coupled to the content addressable memory to receive the match signal, and to access a data signal according to the match signal and a DRAM control signal;

a DRAM, coupled to the content addressable memory to receive the match signal and the DRAM address data, and to access the data signal according to the match signal, the DRAM address signal and the DRAM control signal; and a DRAM control logic circuit, coupled to the system bus, the content addressable memory, the DRAM control signal and the data signal, to perform one of the following operations:

data signal access in the SRAM;

data signal access in the DRAM; and data written into the content addressable memory.

2. The DRAM module according to claim 1, wherein the damaged address recorder comprises a flash memory.

3. The DRAM module according to claim 1, wherein the damaged address recorder comprises an electrically erasable programmable read only memory.

4. The DRAM module according to claim 1, wherein the damaged address recorder comprises an electrically programmable read only memory.

5. The DRAM module according to claim 1, wherein the damaged address recorder comprises a programmable logic array.

6. The DRAM module according to claim 1, wherein the damaged address recorder comprises a programmable fuse.

7. The DRAM module according to claim 1, wherein the damaged address data are written in the content addressable memory by a software.

8. The DRAM module according to claim 1, wherein when the DRAM address data is the same as one of the damaged address data, the match signal is activated to enable a certain address of the SRAM, and to disable an output enabling signal of the DRAM.

9. The DRAM module according to claim 1, wherein when the DRAM address data is not the same as any of the damaged address data, the match signal is disabled, so that the DRAM is operated normally without enabling the SRAM.

10. The DRAM module according to claim 1, wherein the damaged address data provides a parity bit to determine whether the damaged address data are either valid or invalid data.

11. The DRAM module according to claim 10, wherein when the damaged address data are invalid data, the parity bit disables the match signal.

12. A method of using a SRAM to replace a damaged DRAM cell, comprising comparing a plurality of damaged address data with a DRAM address data, so as to output a match data to enable a certain address in the SRAM, and to disable an output enabling signal of the DRAM, wherein step of comparison is executed by a content addressable memory.

13. The method according to claim 12, wherein the DRAM is operated normally when the DRAM address data is different from any of the damaged address data.

14. An apparatus using a SRAM to replace a damaged DRAM cell, coupled to a SRAM, a DRAM and a system bus, the apparatus comprising:
   a damaged address recorder, to pre-store a plurality of damaged address data;
   a content addressable memory, coupled to the damaged address recorder, the SRAM and the DRAM, to compare the damaged address data with a DRAM address data to output a match signal; and
   a DRAM control logic circuit, coupled to the system bus, the content addressable memory, the DRAM and the SRAM, to receive the DRAM address data, a DRAM control signal and a data signal, to perform one of the following operations:
      data signal processing in the SRAM;
      data signal processing in the DRAM; and
      writing the data signal in the content addressable memory.

15. The apparatus according to claim 14, wherein the damaged address data comprises a flash memory.

16. The apparatus according to claim 14, wherein damaged address data comprises an electrically erasable programmable read only memory.

17. The apparatus according to claim 14, wherein the damaged address data comprises an electrically programmable read only memory.

18. The apparatus according to claim 14, wherein the damaged address data comprises a programmable logic array.

19. The apparatus according to claim 14, wherein the damaged address data comprises a programmable fuse.

20. The apparatus according to claim 14, wherein the damaged address data are written into the content addressable memory by a software.

21. The apparatus according to claim 14, wherein when the DRAM address data is the same as one of the damaged address data, the match signal is activated to enable a certain address of the SRAM, and an output enabling signal of the DRAM is disabled.

22. The apparatus according to claim 14, wherein when the DRAM address signal is different from any of the damaged address data, the match signal is disabled, the SRAM is not enabled, and the DRAM is operated normally.

23. The apparatus according to claim 14, wherein the damaged address data provide a parity bit to determine whether the damaged address data are valid or invalid data.

24. The apparatus according to claim 14, wherein the parity bit disable the match signal when the damaged address data are invalid.

25. An apparatus using a SRAM to replace a damaged DRAM cell, coupled to a SRAM, a DRAM and a system bus, the apparatus comprising:
   an address recorder, to pre-store a plurality of damaged address data;
   a content addressable memory, coupled to the address recorder, the SRAM and the DRAM, to compare the damaged address data with a DRAM address data to output a match signal; and
   a DRAM control logic circuit, coupled to the system bus, the content addressable memory, the DRAM and the SRAM, to receive the DRAM address data a DRAM control signal and a data signal.

26. The apparatus according to claim 25, wherein, the DRAM control logic circuit at least perform one of the following operations:
   data signal processing in the SRAM;
   data signal processing in the DRAM; and
   writing the data signal in the content addressable memory.

27. An apparatus comprising means for identifying a plurality of address data by their content, means for comparing a plurality of damaged address data with a DRAM address data, and means for generating at least a signal for disabling at least one output enabling signal in response to a match of one of the damaged address data with the DRAM address data.

28. A method of using a SRAM to replace a damaged DRAM cell, comprising:
   identifying a plurality of address data by their content;
   comparing a plurality of damaged address data with a DRAM address data; and
   generating at least a signal for disabling at least one output enabling signal in response to a match of one of the damaged address data with the DRAM address data.

29. A method of using a SRAM to replace a damaged DRAM cell, comprising:
   pre-storing a plurality of damaged address data into an address recorder; and
   coupling the address recorder a content addressable memory, the SRAM and the DRAM, wherein the damaged address data is compared with a DRAM address data using the content addressable memory to output a match signal.

* * * * *